United States Patent
Draxler

(10) Patent No.: US 9,421,640 B2
(45) Date of Patent: Aug. 23, 2016

(54) DICING METHOD

(71) Applicant: ams AG, Unterpremstaetten (AT)

(72) Inventor: Walter Draxler, Voitsberg (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/764,962

(22) PCT Filed: Jan. 21, 2014

(86) PCT No.: PCT/EP2014/051132
§ 371 (c)(1),
(2) Date: Jul. 30, 2015

(87) PCT Pub. No.: WO2014/118035
PCT Pub. Date: Aug. 7, 2014

(65) Prior Publication Data
US 2015/0367450 A1     Dec. 24, 2015

(30) Foreign Application Priority Data
Jan. 31, 2013   (EP) ..................... 13153528

(51) Int. Cl.
| | |
|---|---|
| *H01L 21/00* | (2006.01) |
| *B28D 5/02* | (2006.01) |
| *B23K 26/40* | (2014.01) |
| *B81C 1/00* | (2006.01) |
| *C03B 33/02* | (2006.01) |
| *H01L 21/78* | (2006.01) |

(52) U.S. Cl.
CPC ............ *B23K 26/364* (2015.10); *B23K 26/402* (2013.01); *B28D 5/022* (2013.01); *B81C 1/00531* (2013.01); *C03B 33/0222* (2013.01); *H01L 21/78* (2013.01); *B23K 2203/52* (2015.10); *B23K 2203/54* (2015.10); *B23K 2203/56* (2015.10)

(58) Field of Classification Search
CPC .. H01L 21/78; H01L 21/6836; B23K 26/364; B23K 26/402; B28D 5/22
See application file for complete search history.

(56) References Cited

U.S. PATENT DOCUMENTS

| | | |
|---|---|---|
| 8,058,103 B2 | 11/2011 | Fukumitsu et al. |
| 2004/0075717 A1 | 4/2004 | O'Brien et al. |
| 2005/0277270 A1 | 12/2005 | Yoshikawa et al. |
| 2007/0272666 A1 | 11/2007 | O'Brien et al. |
| 2007/0272668 A1 | 11/2007 | Albelo et al. |
| 2008/0277806 A1 | 11/2008 | Chen et al. |
| 2010/0081255 A1 | 4/2010 | Poonjolai |
| 2010/0133659 A1 | 6/2010 | Hara et al. |

FOREIGN PATENT DOCUMENTS

| | | |
|---|---|---|
| GB | 2459669 A | 11/2009 |
| JP | S5836939 A | 3/1983 |

*Primary Examiner* — Richard Booth
(74) *Attorney, Agent, or Firm* — McDermott Will & Emery LLP

(57) ABSTRACT

The method comprises providing a substrate like a semiconductor wafer (1), applying a laser cut (4) of the substrate, and subsequently applying a saw to divide the substrate from a main surface (10). The laser cut (4) may be used to cut along boundaries of saw streets (7).

8 Claims, 2 Drawing Sheets

DICING METHOD

BACKGROUND OF THE INVENTION

Semiconductor wafers are usually diced by sawing or laser cutting. Chips that are obtained from the wafer by sawing usually show chipping on both sides of the sawing line, and cracks are liable to occur.

U.S. Pat. No. 8,058,103 B2 discloses a method for cutting a semiconductor wafer by irradiation with laser light, which generates a starting point region for cutting within the wafer. By attaching an expansion film to the rear face and expanding the film, a fracture is generated from the starting point region to the front and rear surfaces of the wafer. In a variant of this method the fracture is generated by a means for applying stress, such as a knife edge that is pressed against the rear face of the silicon wafer in the direction along the starting point region.

SUMMARY OF THE INVENTION

The dicing method comprises providing a substrate, especially a semiconductor wafer, applying a laser cut to the substrate, and subsequently applying a saw to divide the substrate from a main surface.

In a variant of the method the laser cut is directed to lateral boundaries of a saw street.

In a further variant the laser cut allows the substrate to be divided with the saw not completely penetrating the substrate.

In a further variant the laser cut is directed to a partial volume of the substrate. The partial volume may especially be located opposite the main surface. The partial volume may especially amount to more than 5% and less than 40%, or more specifically to more than 10% and less than 30% of the total volume of the substrate.

In a further variant the substrate is a semiconductor wafer. The partial volume may especially include a layer of integrated components.

In further variants the substrate comprises glass or ceramics or is provided for microelectromechanical systems.

The following is a detailed description of examples of the method.

DETAILED DESCRIPTION

Figure 1:
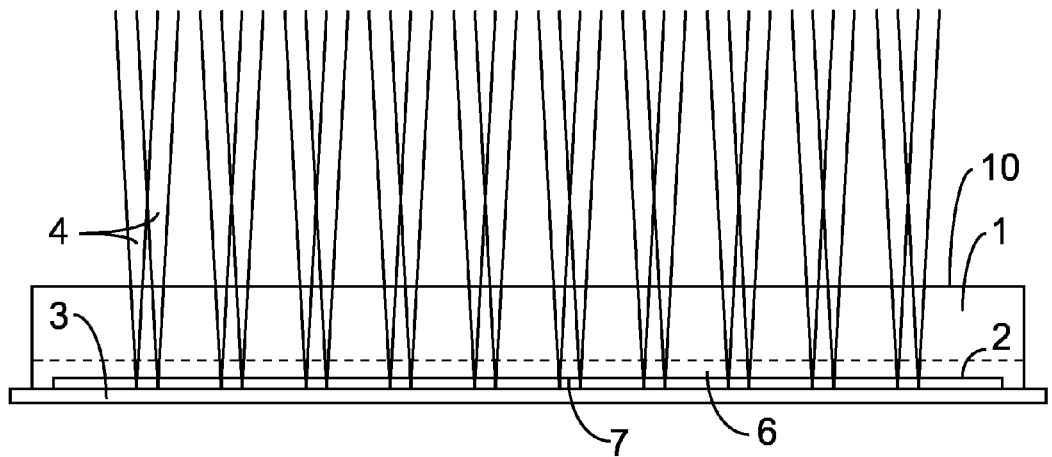
FIG. 1 is a cross section of a substrate that is to be diced during the application of laser light.

FIG. 1 is a cross section of a substrate 1 that is to be diced from an outer surface, which is here referred to as the main surface 10. The substrate 1 may be a semiconductor wafer, for instance, a glass substrate, a ceramics substrate or a substrate that is provided for microelectromechanical systems. The method may also be applied to other kinds of substrates that are diced into smaller components. In the following the method is described for a semiconductor wafer representing the substrate 1. The method can similarly be applied to other substrates.

The wafer 1 is typically diced into chips at the end of a process in which integrated components are produced in the wafer. FIG. 1 shows an example in which the main surface 10 is opposite a layer of integrated components 2. The wafer 1 may instead be diced from the surface comprising the integrated components. In the following the method is described for an example in which the integrated components are opposite the main surface 10. A tape or foil 3, especially an adhesive tape or foil 3, may be applied to the wafer 1 opposite the main surface 10 to facilitate the handling.

A laser cut 4 is performed from the main surface 10 into the wafer 1. The laser beams shown in FIG. 1 may in particular be focused to regions within a partial volume 6 of the wafer 1 opposite the main surface 10. In the example shown in FIG. 1 the laser cut 4 is directed to the lateral boundaries of a saw street 7. When the lateral boundaries of the saw street 7 are thus prepared, the subsequent cutting by means of a saw yields sufficiently smooth cutting faces forming a barrier where cracking or chipping will be stopped. Even if the wafer 1 has a thickness of more than 100 µm, the method allows a very small width of the saw street 7 of typically about 30 µm, for example, because the laser cut 4 is sufficiently precise and allows a gap of 30 µm between the laser lines.

Figure 2:
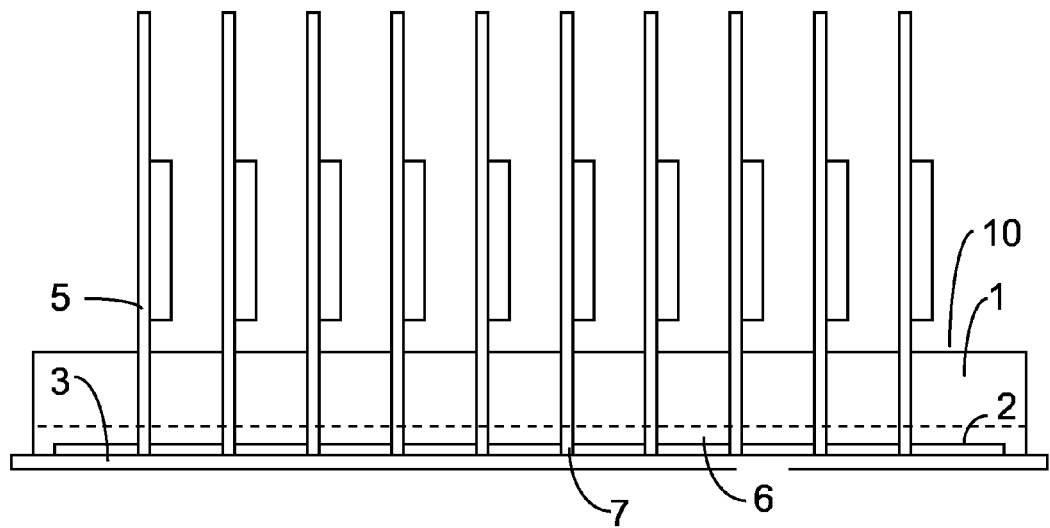
FIG. 2 is a cross section of the substrate during the application of a saw.

FIG. 2 is a cross section of the wafer 1 during the application of a saw 5. The blade of the saw 5 divides the wafer 1 into chips. In this variant of the method the blade of the saw 5 completely penetrates the wafer 1. Chipping or cracking is prevented by the preparation of the saw cut through the partial volume 6, where cuts have already been applied to the boundaries of the saw street 7 by the preceding laser cut 4. The partial volume 6 may typically comprise a range from 5% to 40% or, more specifically, from 10% to 30% of the wafer thickness.

Figure 3:
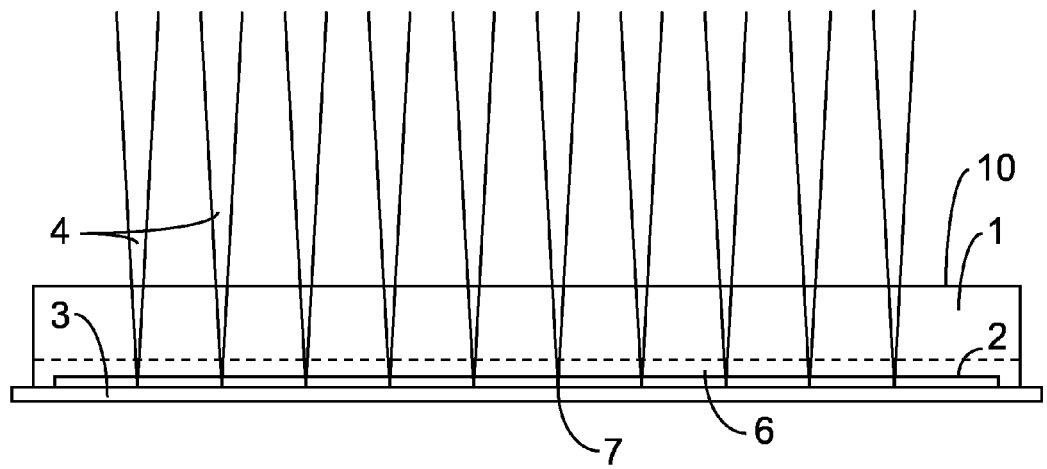
FIG. 3 is a cross section according to FIG. 1 for a variant of the method.

FIG. 3 is a cross section according to FIG. 1 for a variant of the method, which uses the laser cut 4 as a partial cut through a partial volume 6 comprising a range from 5% to 40% or, more specifically, from 10% to 30% of the wafer thickness. The laser cut 4 is therefore applied inside the saw street 7 and partially divides the wafer 1 by cuts that are applied in the partial volume 6. If the wafer 1 has a thickness of 200 µm, for example, the partial laser cut 4 may typically divide a portion of the wafer 1 that is about 10 µm to 80 µm or, more specifically, about 20 µm to 60 µm thick.

Figure 4:
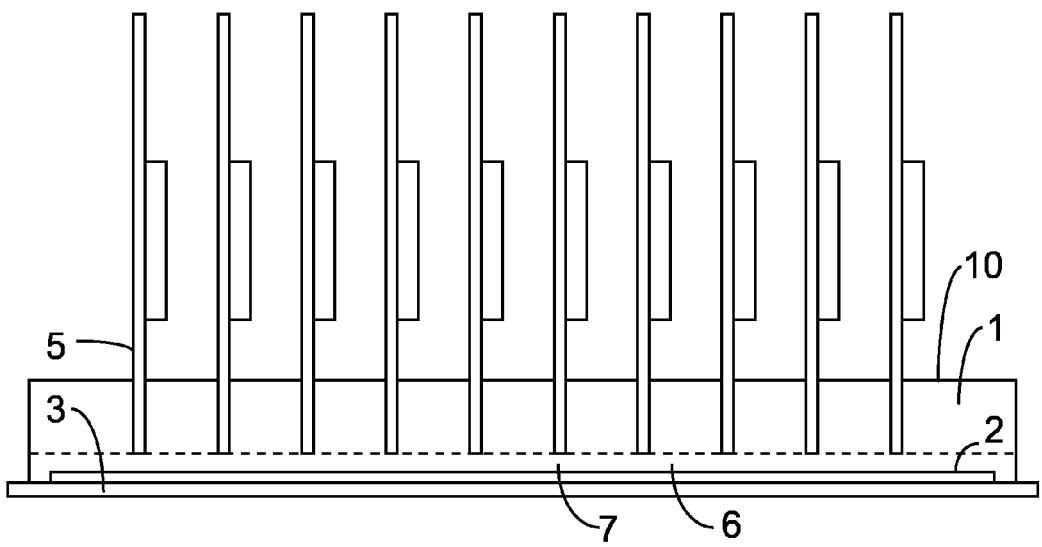
FIG. 4 is a cross section according to FIG. 2 for the variant of the method.

FIG. 4 is a cross section according to FIG. 2 for the variant according to FIG. 3 and shows the saw 5 applied to divide the wafer 1 into chips. The cut of the saw 5 may be restricted to about 60% to 95% or, more specifically, about 70% to 90% of the wafer thickness, because a cut has already been effected in the partial volume 6 by the preceding laser cut 4.

The described method allows a very small width of the saw streets and is in particular advantageous for wafers that are more than 100 µm thick. The risk of chipping and cracking during the sawing process is essentially reduced by the preceding laser cut. A much higher sawing speed than in conventional dicing processes can be achieved with the combination of laser cut and mechanical sawing according to the described method.

The invention claimed is:
1. A dicing method, comprising:
providing a semiconductor wafer as a substrate;
applying a saw to divide the substrate from a main surface;
performing a laser cut of the substrate before the saw is applied; and
directing the laser cut to a partial volume of the substrate opposite the main surface, the partial volume including a layer of integrated components.

2. The method of claim 1, wherein the laser cut is directed to lateral boundaries of a saw street.

3. The method of claim 1, wherein the laser cut allows the substrate to be divided with the saw not completely penetrating the substrate.

4. The method of claim 1, wherein the partial volume amounts to more than 5% and less than 40% of the total volume of the substrate.

5. The method of claim 1, wherein the partial volume amounts to more than 10% and less than 30% of the total volume of the substrate.

6. The method of claim 1, wherein the substrate comprises glass or ceramics.

7. The method of claim 1, wherein the substrate is provided for microelectromechanical systems.

8. A dicing method, comprising:
   providing a semiconductor wafer as a substrate having a main surface;
   forming integrated components in a partial volume of the substrate opposite the main surface;
   performing a laser cut from the main surface into the partial volume of the substrate; and
   applying a saw to divide the substrate from the main surface.

* * * * *